United States Patent
Zhang et al.

(10) Patent No.: US 8,775,892 B2
(45) Date of Patent: Jul. 8, 2014

(54) SYSTEM AND METHOD INCLUDING MODIFIED BIT-INTERLEAVED CODED MODULATION WITH FRACTIONAL SECONDARY CODING

(75) Inventors: Hongbin Zhang, Marlboro, NJ (US); Hussam G. Batshon, Eatontown, NJ (US)

(73) Assignee: Tyco Electronics Subsea Communications LLC, Eatontown, NJ (US)

( * ) Notice: Subject to any disclaimer, the term of this patent is extended or adjusted under 35 U.S.C. 154(b) by 81 days.

(21) Appl. No.: 13/605,950

(22) Filed: Sep. 6, 2012

(65) Prior Publication Data
US 2014/0068385 A1     Mar. 6, 2014

Related U.S. Application Data

(60) Provisional application No. 61/695,737, filed on Aug. 31, 2012.

(51) Int. Cl.
*H03M 13/00*     (2006.01)
*H03M 13/29*     (2006.01)
*H04L 1/00*     (2006.01)

(52) U.S. Cl.
CPC .......... *H03M 13/29* (2013.01); *H03M 13/2903* (2013.01); *H04L 1/0041* (2013.01); *H04L 1/0045* (2013.01)
USPC .......................................... 714/755; 714/758

(58) Field of Classification Search
CPC .......................... H03M 13/29; H03M 13/2903
USPC ......... 714/755, 758, 756, 757, 799, 800, 701, 714/48, 52; 341/94, 143
See application file for complete search history.

(56) References Cited

U.S. PATENT DOCUMENTS

| | | | |
|---|---|---|---|
| 6,034,996 A * | 3/2000 | Herzberg | 375/265 |
| 6,473,878 B1 * | 10/2002 | Wei | 714/755 |
| 6,944,235 B2 * | 9/2005 | Ophir | 375/265 |
| 8,234,538 B2 | 7/2012 | Djordjevic et al. | |
| 8,301,967 B2 * | 10/2012 | Bhaskaran et al. | 714/755 |
| 2007/0118787 A1 | 5/2007 | Schmidt | |

OTHER PUBLICATIONS

Zhang, Hongbin et al, "16QAM Transmission with 5.2 Bits/s/Hz Spectral Efficiency Over Transoceanic Distance" Optics Express, 2012, pp. 11688-11693, vol. 20, issue 11.
Norifumi Kamiya et al: "Concatenated QC-LDPC and SPC codes for 100 Gbps ultra long-haul optical transmission systems", Optical Fiber Communication (OFC), Collocated National Fiber Optic Engineers Conference, 2010 Conference on (OFC/NFOEC), IEEE, Piscataway, NJ, USA, Mar. 21, 2010, pp. 1-3.
International Search Report issued in related application No. PCT/US2013/054819, completed on Apr. 11, 2014.

* cited by examiner

*Primary Examiner* — Christine Tu (57) ABSTRACT

A system and method with a modified bit-interleaved coded modulation with iterative decoding (BICM-ID). A first group of coded and interleaved bits are coded with a second FEC code and a second group of coded and interleaved bits are not coded with the second FEC code. The first and second groups are then mapped to a modulation format. The second FEC code may be a single parity check (SPC) and the scheme may be referred to as a BICM-ID scheme with a fractional secondary coding.

20 Claims, 6 Drawing Sheets

SYSTEM AND METHOD INCLUDING MODIFIED BIT-INTERLEAVED CODED MODULATION WITH FRACTIONAL SECONDARY CODING

CROSS-REFERENCE TO RELATED APPLICATIONS

This application claims the benefit of the filing date of U.S. Provisional Application Ser. No. 61/695,737 filed Aug. 31, 2012, the teachings of which are hereby incorporated herein by reference.

TECHNICAL FIELD

The present application relates to the optical transmission of information and, more particularly, to a system and method including a modified bit-interleaved coded modulation with a fractional secondary coding.

BACKGROUND

In wavelength division multiplexed (WDM) optical communication systems, a number of different optical carrier wavelengths are separately modulated with data to produce modulated optical signals. The modulated optical signals are combined into an aggregate signal and transmitted over an optical transmission path to a receiver. The receiver detects and demodulates the data.

One type of modulation that may be used in optical communication systems is phase shift keying (PSK). According to different variations of PSK, data is transmitted by modulating the phase of an optical wavelength such that the phase or phase transition of the optical wavelength represents symbols encoding one or more bits. In a binary phase-shift keying (BPSK) modulation scheme, for example, two phases may be used to represent 1 bit per symbol. In a quadrature phase-shift keying (QPSK) modulation scheme, four phases may be used to encode 2 bits per symbol. Other phase shift keying formats include differential phase shift keying (DPSK) formats and variations of PSK and DPSK formats, such as return-to-zero DPSK (RZ-DPSK) and phase division multiplexed QPSK (PDM-QPSK).

A modulation format, such as QPSK wherein multiple data bits are be encoded on a single transmitted symbol may be generally referred to as a multi-level modulation format. Multi-level modulation techniques have been used, for example, to allow increased transmission rates and decreased channel spacing, thereby increasing the spectral efficiency (SE) of each channel in a WDM system. One spectrally efficient multi-level modulation format is quadrature amplitude modulation (QAM). In a QAM signal, information is modulated using a combination of phase shift keying and amplitude shift keying, for example, to encode multiple bits per symbol. A 16-QAM modulation format may be used, for example, to encode 4 bits per symbol. Certain PSK modulation schemes (e.g., BPSK and QPSK) may be referred to as a level of QAM (e.g., 2QAM and 4QAM respectively).

One problem associated with optical communication systems is maintaining the integrity of the data being communicated, particularly when optical signals are transmitted over long distances in long-haul communication systems. Accumulated noise contributed by many different sources in a transmission path may cause degradation of the signals and may cause difficulty in differentiating between the binary digits (i.e., the ones and zeros) in a data stream.

Forward Error Correction (FEC) is a technique used to help compensate for this degradation. FEC is essentially the incorporation of a suitable code into a data stream at the transmitter. The transmitter receives a data stream and encodes the data stream using an FEC encoder that introduces some redundancy in the binary information sequence of the data stream. The receiver receives the encoded data and runs it through an FEC decoder to detect and correct errors.

Gray mapping has also been applied to achieve improvements in detection. Gray mapping is a known process wherein a non-weighted code is assigned to each of a contiguous set of bits such that adjacent code words differ by one symbol, i.e. they have a Hamming distance of 1. For example, in a 16 QAM system where data is transmitted in symbols representing 4-bits the constellation diagram of the signal is arranged with Gray mapping such that Gray coded patterns of 4-bits conveyed by adjacent constellation points differ by only one bit. Combining Gray mapping with FEC can facilitate correction of transmission errors that cause a constellation point in the signal constellation diagram to deviate into the area of an adjacent point.

One approach to combining data modulation with FEC coding is known as bit-interleaved coded-modulation (BICM). In a BICM scheme FEC coding is applied to a data stream and the FEC coded data stream is then bit-interleaved (i.e. the order of the bits is permuted). The coded and interleaved data stream is then modulated according to a selected data modulation with, or without, Gray mapping. The performance of BICM can be further increased in some cases by exchanging information between the de-mapper and the decoder and performing iterative decoding (ID). BICM schemes with ID decoding are known as BICM-ID schemes.

A modified BICM-ID coded modulation scheme that provides an improvement over conventional BICM-ID schemes is described in U.S. patent application Ser. No. 13/569,628 (the '628 application), the teachings of which are hereby incorporated herein by reference. The '628 application describes a scheme wherein coded and interleaved bits are combined and coded with a second FEC code that is then mapped to a modulation format. In one particularly advantageous embodiment described in the '628 application the second FEC code is a single parity check (SPC) and the scheme may be referred to as a SPC-BICM-ID scheme. In such an embodiment, the incoming data stream may be demultiplexed into a plurality of data streams with each of the data streams being coded with a low density parity check (LDPC) FEC code and then bit-interleaved. The bit-interleaved and coded LDPC data may then be combined and coded with the single parity check (SPC) and Gray mapped to one or more QAM symbols. Iterative decoding may be performed at the receiver to achieve bit error rate (BER) performance that improves with successive iterations. One SPC-BICM-ID embodiment of such a scheme with a LDPC FEC code may allow transmission of 104 Gbit/s polarization division multiplexed (PDM)-16QAM data over at least 6,800 km at 20 GHz WDM channel spacing to achieve a 5.2 bits/s/Hz spectral efficiency.

BRIEF DESCRIPTION OF THE DRAWINGS

Reference should be made to the following detailed description which should be read in conjunction with the following figures, wherein like numerals represent like parts.

DETAILED DESCRIPTION

In general, a system consistent with the present disclosure implements a modified BICM-ID scheme with a fractional secondary code. Input signal bits are coded and interleaved and are provided in first and second groups. A first group of the coded and interleaved bits is coded with a second FEC code to provide a group of second FEC code encoded bits including the first group of coded and interleaved bits and FEC coding overhead associated with the second FEC code. The second group of coded and interleaved bits is not coded with the second FEC code. The second FEC code encoded bits and the second group of coded and interleaved bits may then be mapped to a modulation format. In one embodiment, the second FEC code encoded bits and the second group of coded and interleaved bits may be separately block interleaved prior to mapping.

Since the first group of coded and interleaved bits is encoded with the second FEC code and the second group of coded and interleaved bits is not encoded with the second FEC code, i.e. only a portion of all the coded and interleaved bits is encoded with the second FEC code, a modulation scheme consistent with the present disclosure may be referred to as BICM-ID with a fractional secondary code. In one particularly advantageous embodiment the second FEC code may be a single parity check (SPC) code that adds a single parity bit as the FEC coding overhead. In such an embodiment, the number of second FEC code encoded bits (i.e. the number of bits in the first group of coded and interleaved bits plus the parity bit) may be equal to the number of bits in the second group of coded and interleaved bits and the scheme may be referred to as a half single parity check (HSPC)-BICM-ID scheme. In such an embodiment, the coded and interleaved bits may be established by demultiplexing an incoming data stream into a plurality of data streams with each of the data streams being coded with a low density parity check (LDPC) FEC code and then bit-interleaved. Iterative decoding may be performed at the receiver to achieve bit error rate (BER) performance that improves with successive iterations.

As used herein an "FEC code" refers to a scheme whereby one or more bits (the overhead associated with the code) are added to a data stream to assist in detection or correction of data errors. As used herein a "map" or "mapping" refers to a known scheme whereby a code is assigned to each of a contiguous set of bits and does not involve adding additional bits to a data stream (i.e. mapping has no overhead). As used herein a "Gray map" or "Gray mapping" refers to the known Gray mapping scheme whereby a code is assigned to each of a contiguous set of bits such that adjacent code words differ by one symbol and does not involve adding additional bits to a data stream (i.e. Gray mapping has no overhead). The term "coupled" as used herein refers to any connection, coupling, link or the like by which signals carried by one system element are imparted to the "coupled" element. Such "coupled" devices, or signals and devices, are not necessarily directly connected to one another and may be separated by intermediate components or devices that may manipulate or modify such signals.

Figure 1:
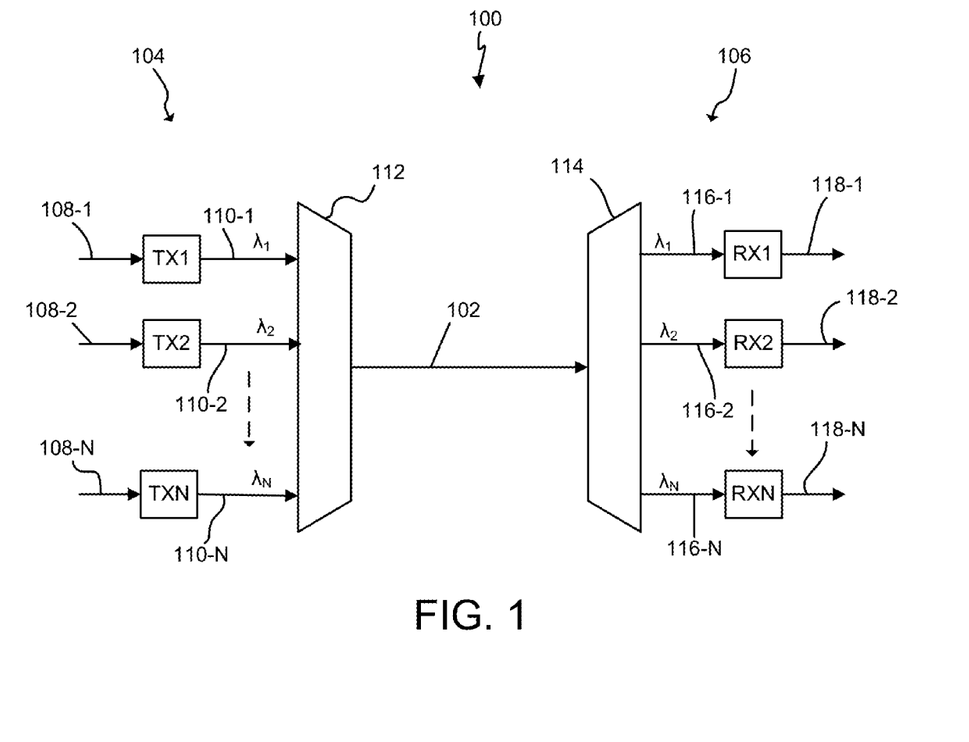
FIG. 1 is a block diagram of one exemplary embodiment of a system consistent with the present disclosure.

FIG. 1 is a simplified block diagram of one exemplary embodiment of a WDM transmission system 100 consistent with the present disclosure. The transmission system serves to transmit a plurality of optical channels over an optical information path 102 from a transmitting terminal 104 to one or more remotely located receiving terminals 106. The exemplary system 100 may be a long-haul submarine system configured for transmitting the channels from a transmitter to a receiver at a distance of 5,000 km, or more. Although exemplary embodiments are described in the context of an optical system and are useful in connection with a long-haul WDM optical system, the broad concepts discussed herein may be implemented in other communication systems transmitting and receiving other types of signals.

Those skilled in the art will recognize that the system 100 has been depicted as a highly simplified point-to-point system for ease of explanation. For example, the transmitting terminal 104 and receiving terminal 106 may, of course, both be configured as transceivers, whereby each may be configured to perform both transmitting and receiving functions. For ease of explanation, however, the terminals are depicted and described herein with respect to only a transmitting or receiving function. It is to be understood that a system and method consistent with the disclosure may be incorporated into a wide variety of network components and configurations. The illustrated exemplary embodiments herein are provided only by way of explanation, not of limitation.

In the illustrated exemplary embodiment, each of a plurality of transmitters TX1, TX2 . . . TXN receives a data signal on an associated input port 108-1, 108-2 . . . 108-N, and transmits the data signal on associated wavelength $\lambda_1, \lambda_2 \ldots \lambda_N$. One or more of the transmitters TX1, TX2 . . . TXN may be configured to modulate data on the associated wavelength with using a modified BICM-ID scheme consistent with the present disclosure. The transmitters, of course, are shown in highly simplified form for ease of explanation. Those skilled in the art will recognize that each transmitter may include electrical and optical components configured for transmitting the data signal at its associated wavelength with a desired amplitude and modulation.

The transmitted wavelengths or channels are respectively carried on a plurality of paths 110-1, 110-2 . . . 110-N. The data channels are combined into an aggregate signal on optical path 102 by a multiplexer or combiner 112. The optical information path 102 may include optical fiber waveguides, optical amplifiers, optical filters, dispersion compensating modules, and other active and passive components.

The aggregate signal may be received at one or more remote receiving terminals 106. A demultiplexer 114 separates the transmitted channels at wavelengths $\lambda_1, \lambda_2 \ldots \lambda_N$ onto associated paths 116-1, 116-2 . . . 116-N coupled to associated receivers RX1, RX2 . . . RXN. One or more of the receivers RX1, RX2 . . . RXN may be configured to demodulate the transmitted signal using iterative decoding associated with a modified BICM-ID scheme consistent with the present disclosure and may provide an associated output data signal on an associated output path 118-1, 118-2, 118-3, 118-N.

Figure 2:
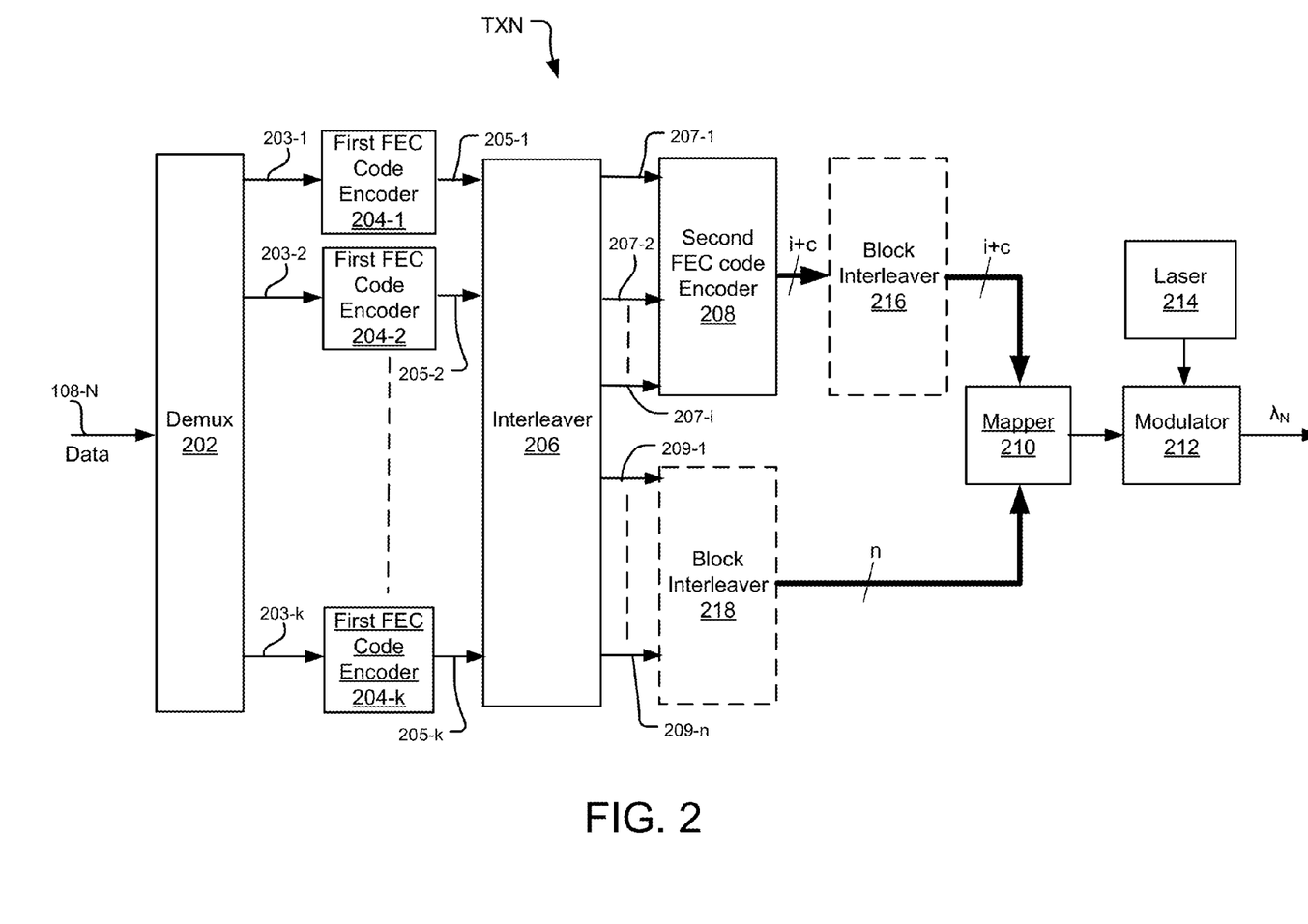
FIG. 2 is a block diagram of one exemplary embodiment of a transmitter consistent with the present disclosure.

FIG. 2 is a simplified block diagram of one exemplary transmitter TXN consistent with the present disclosure. The illustrated exemplary transmitter TXN includes a demultiplexer 202, a plurality of first FEC code encoders 204-1, 204-2 . . . 204-k, an interleaver 206, a second FEC encoder 208, a mapper 210, and a modulator 212 for modulating the output of a continuous-wave laser 214 for providing a coded and modulated output on a carrier wavelength $\lambda_N$. The transmitter TXN may also include first 216 and second 218 optional block interleavers. In the illustrated embodiment, the transmitter TXN is shown as transmitting a single polarization for ease of explanation. Those of ordinary skill in the art will recognize that a transmitter consistent with the present disclosure may be configured for transmitting a polarization multiplexed (POLMUX) signal by duplicating the illustrated configuration for transmitting data on each polarization.

The demultiplexer 202 may take a known configuration for receiving a serial input data stream 118-N and demultiplexing the input data stream 118-N into k separate parallel data streams, i.e. every $k^{th}$ bit is separated by the demultiplexer 202 onto the $k^{th}$ data path 203-1, 203-2 . . . 203-k. Each of the k data streams are coupled to an associated one of the first FEC code encoders 204-1, 204-2 . . . 204-k. The first FEC code encoders 204-1, 204-2 . . . 204-k may each be configured to encode the data stream received thereby with an associated first FEC code and provide an output data stream encoded with the first FEC code on an associated output path 205-1, 205-2 . . . 205-k.

Numerous FEC codes are known, each with different properties related to how the codes are generated and consequently how they perform. Examples of known error correcting codes include the linear and cyclic Hamming codes, the cyclic Bose-Chaudhuri-Hocquenghem (BCH) codes, the convolutional (Viterbi) codes, the cyclic Golay and Fire codes, Turbo convolutional and product codes (TCC, TPC), and low density parity check codes (LDPC). A parity check code such as a single parity check (SPC) code is another well-known FEC code. Hardware and software configurations for implementing various error correcting codes in the first FEC code encoders 204-1, 204-2 . . . 204-k and corresponding decoders 408-1, 408-2 . . . 408-k (FIG. 4) are known to those of ordinary skill in the art.

The encoded outputs 205-1, 205-2 . . . 205-k of each of the first FEC code encoders 204-1, 204-2 . . . 204-k are coupled to the interleaver 206. In general, an interleaver is configured to permute the order of input bits or blocks of the input bits and provide the permuted bits at an associate output. A variety of interleaver configurations are known. In the illustrated embodiment, the interleaver 206 receives k output code words from the first FEC encoders 204-1, 204-2 . . . 204-k and provides a parallel output of k interleaved bits, each of which interleaved bits is provided on an associated path 207-1, 207-2 . . . 207-k or 209-1 . . . 209-n. Although in the illustrated embodiment, the interleaver 206 interleaves the k output bits of the first FEC encoders 204-1, 204-2 . . . 204-k, those of ordinary skill in the art will recognize that other interleaving configurations may be implemented in a system consistent with the present disclosure.

A first group of the k interleaved outputs, i.e. the outputs on paths 207-1, 207-2 . . . 207-i, is coupled to the second FEC code encoder 208. The second FEC code encoder 208 receives the i encoded and interleaved outputs of the interleaver 206 and encodes the i bits with a second FEC code. If the second FEC code encoder has a coding overhead of c bits, the second FEC encoder provides plurality of second FEC code encoder outputs including the first group of i coded and interleaved bits plus the c FEC coding overhead bits associated with the second FEC code (i+c). Each of the second FEC code encoder outputs is provided on an associated one of i+c parallel paths.

The plurality second FEC code encoder outputs are coupled to the mapper 210. In some embodiments, the second FEC code encoder outputs are coupled to the mapper 210 through an optional block interleaver 216. The block interleaver 216 is configured to permute the order of blocks of input bits and provide the permuted blocks bits at associated outputs. A variety of block interleaver configurations are known. In the illustrated embodiment, the block interleaver 216 receives i+c parallel second FEC code encoder outputs and permutes the order of each block of i+c parallel second FEC code encoder outputs to provide interleaved blocks of i+c bits with each bit on an associated one of i+c parallel output paths coupled to the mapper 210. Although in the illustrated embodiment, the interleaver 216 interleaves blocks of the second FEC encoder outputs, those of ordinary skill in the art will recognize that other interleaving configurations may be implemented in a system consistent with the present disclosure.

A second group of n interleaved outputs from the interleaver 206, i.e. the outputs on paths 209-1 . . . 209-n, is coupled to the mapper without being encoded with the second FEC code. The number n of interleaved outputs in the second group may be equal to, or different from, the number i of interleaved outputs in the first group plus the c over head bits associated with the second FEC code. The second group of interleaved outputs may be coupled to the mapper 210 through a block interleaver 218, which may take the same configuration as the block interleaver 216. The block interleaver 218 receives second group of n interleaved outputs and permutes the order of each block of the second group of n interleaved outputs to provide interleaved blocks of n bits with each bit on an associated one of n parallel output paths coupled to the mapper.

Figure 3A:
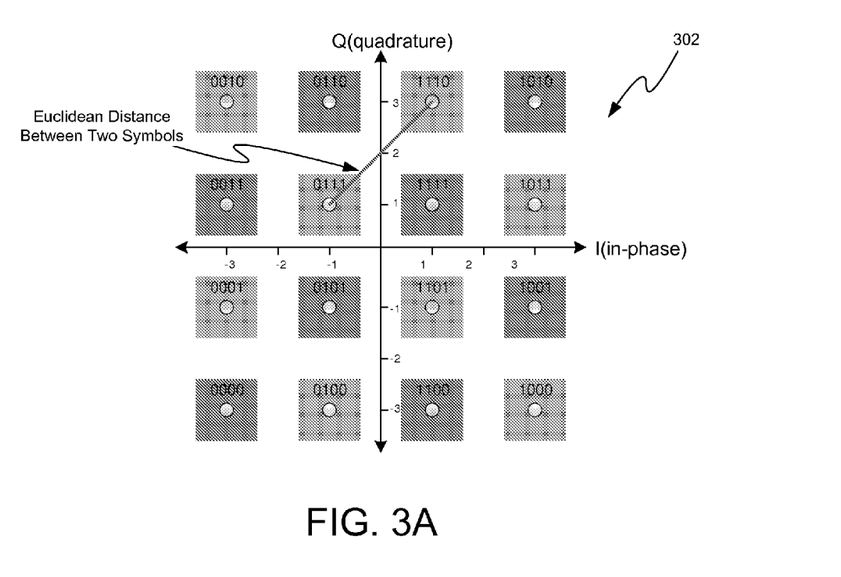
FIG. 3A is a constellation diagram of one exemplary embodiment 16QAM signal with Gray mapping consistent with the present disclosure.

The mapper 210 may be configured to map the i+c second FEC code encoder outputs, either in multiple groups or a single group of i+c bits, and groups of second group of n interleaved outputs, either in multiple groups or a single group of n bits, to associated symbols using a mapping scheme, such as a Gray map. Bits may be mapped by the mapper 210 to establish any known modulation method. For example, in an embodiment including n second FEC code encoder outputs (i.e. i+c=n) the n second FEC code encoder outputs and the second group of n interleaved outputs may each be mapped into either one $2^n$ QAM symbol or two $2^{n/2}$ QAM symbols. FIG. 3A is one embodiment of a constellation diagram 302 of a 16QAM signal with Gray mapping of each 4-bits of n second FEC code encoder outputs and the second group of n interleaved outputs.

The mapper 210 may map the second FEC code encoder outputs and the second group of interleaved outputs in any order. In one embodiment, the mapper 210 may alternately map one or more groups of the second FEC code encoder outputs followed by one or more groups of the second group of interleaved outputs. If the mapper 210 maps both the second FEC code encoder outputs and the second group of interleaved outputs in multiple groups, it may alternately map multiple groups of the second FEC code encoder outputs follow by multiple groups of the second group of interleaved outputs.

The mapped second FEC code encoder outputs bits and second group of interleaved output bits may be modulated onto an optical carrier wavelength $\lambda_N$ of a continuous-wave laser 214 using a known modulator 212. The encoded, mapped and modulated output of the modulator 212 may be coupled to the multiplexer 112 (FIG. 1) in a WDM system.

The second FEC code generated by the second FEC code encoder 208 may be any known FEC code with any number of associated coding overhead bits. One FEC code that is particularly useful as a second FEC code in a scheme consistent with the present disclosure is a known single parity check (SPC) code. A SPC code adds a single parity bit (coding overhead of 1-bit) to the i bits of the first group of interleaved bits from the interleaver 206. The parity bit indicates the parity (odd or even number of ones in the bit stream) of the i data bits associated therewith.

Figure 3B:
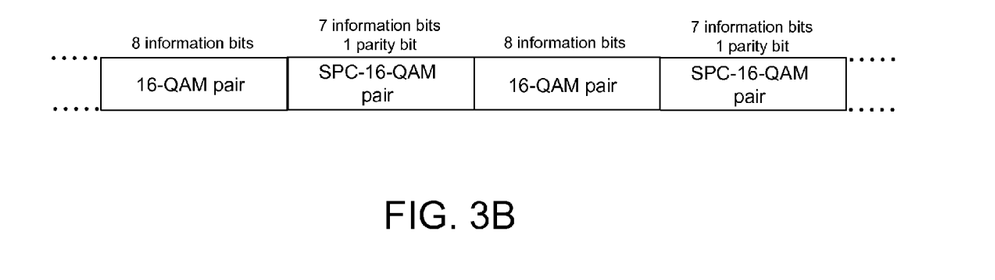
FIG. 3B diagrammatically illustrates one embodiment of a modulated signal consistent with the present disclosure.

A modified BICM-ID scheme consistent with the present disclosure wherein the second FEC code is an SPC code and the number of second FEC code encoded bits is equal to the number of the second group of interleaved bits (i.e. i+c=n) may be referred to as half single parity check (HSPC)-BICM-ID scheme, since the n second FEC code encoder bits represents only half of the bits mapped by the mapper 210. FIG. 3B diagrammatically illustrates a modulated output associated with a HSPC-BICM-ID scheme consistent with the present disclosure wherein the number of the second FEC code encoder output bits is 8(i.e. i=7 and c=1), and the number of the second group of interleaved bits is 8. In the illustrated embodiment, the mapper 210 alternately maps pairs of symbols from the second FEC code encoder output bits and the second group of interleaved bits according to a 16-QAM format with each symbol mapped as shown for example in FIG. 3A. As shown, the resulting modulated signal includes 16-QAM pairs (8 bits) associated with the second group of interleaved outputs alternately interleaved with SPC-16-QAM pairs associated with the second FEC code encoder outputs (7 bits plus 1 parity bit).

A HSPC-BICM-ID scheme as illustrated in FIG. 3A allows use of a relatively strong FEC code as the first FEC code imparted by the first FEC encoders 204-1, 204-2 . . . 204-$k$ while achieving high spectral efficiency. The first FEC code may, for example, impart a coding overhead of greater than or equal to 20%. In one embodiment, a HSPC-BICM-ID scheme as illustrated in FIG. 3A may transmit 104 Gbits/s of information bits over greater than 6000 km using a first FEC code (e.g. a LDPC code) with overhead of 20% at a 16.64 GHz bandwidth with 17 GHz channel spacing to achieve a spectral efficiency of 6.12 bit/s/Hz.

In a WDM system 100, the optical output of the modulator 212 may be coupled to the multiplexer 112 and multiplexed with optical outputs of other transmitters into an aggregate signal for transmission over the optical information channel 102. The demultiplexer 114 at the receiving terminal may demultiplex the aggregate signal and the demultiplexed optical signals maybe coupled to associated receivers. The receivers are configured for demodulating and decoding the optical signals to reproduce the associated data streams 118-N.

Figure 4:
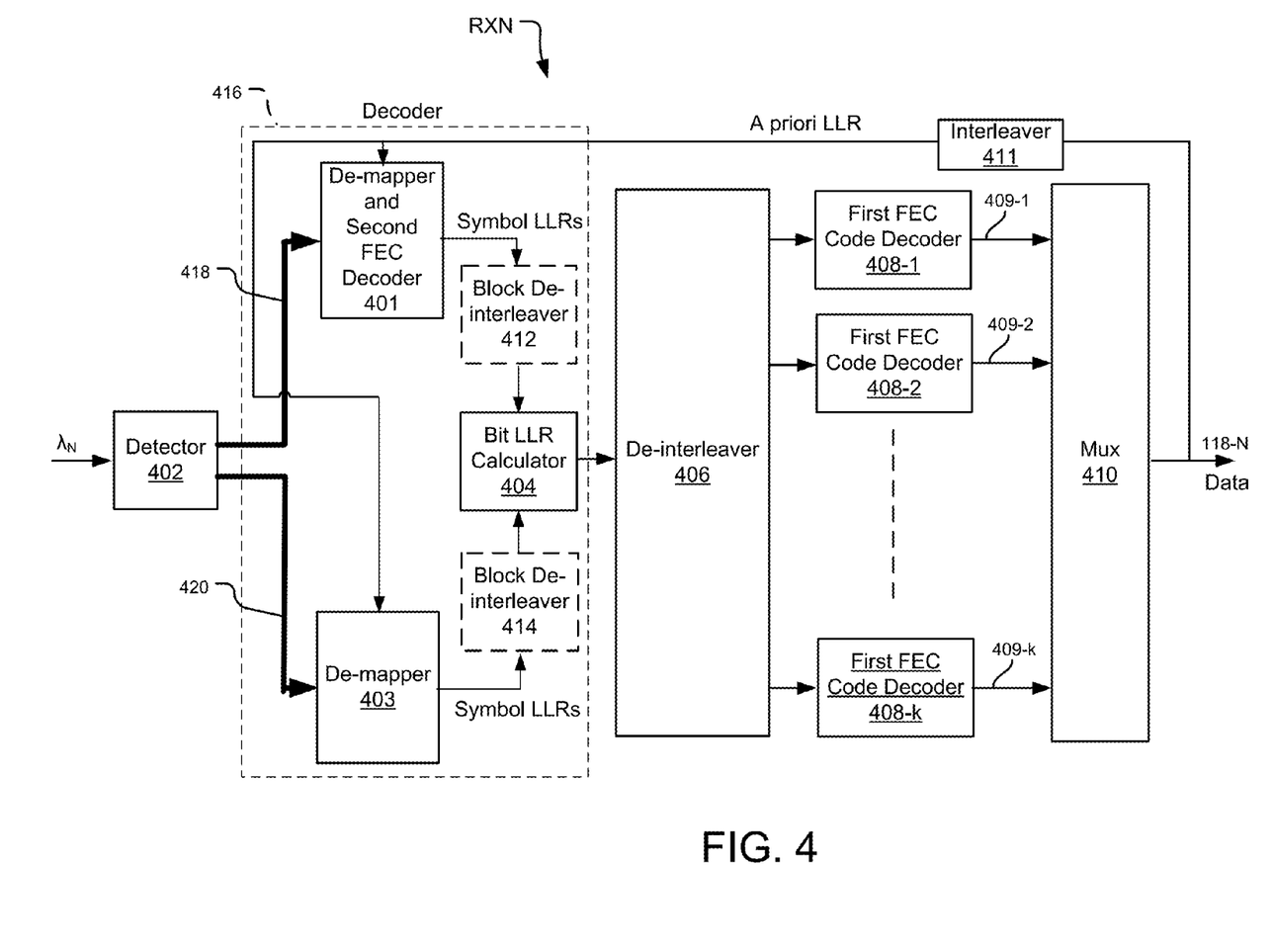
FIG. 4 is a block diagram of one exemplary embodiment of a receiver consistent with the present disclosure.

FIG. 4 is a simplified block diagram of one exemplary receiver RXN consistent with the present disclosure. The illustrated exemplary embodiment RXN includes a detector 402, a decoder 416, a de-interleaver 406, a plurality of first FEC code decoders 408-1, 408-2 . . . 408-$k$, a multiplexer 410, and an interleaver 411. The decoder 416 includes a de-mapper and second FEC decoder 401, a de-mapper 403 and a bit LLR calculator 404, and may also include first 412 and second 414 optional block de-interleavers. In the illustrated embodiment, the receiver is shown as receiving a single polarization for ease of explanation. Those of ordinary skill in the art will recognize that a receiver consistent with the present disclosure may be configured for receiving a polarization multiplexed signal (POLMUX) by duplicating the illustrated configuration for receiving data modulated on each polarization.

The detector 402 may be configured to receive the optical signal modulated on the carrier wavelength $\lambda_N$ and to convert the optical signal into a digital electrical signal. In one embodiment, for example, the detector 402 may be provided in a known coherent receiver configuration, e.g. a polarization diversity coherent receiver, with a digital signal processing (DSP) circuit. The DSP circuit may process the output of the coherent receiver to provide a digital electrical output signal to the decoder 416 and that reproduces the output signal of the mapper 210 in the transmitter.

In general, the decoder 416 decodes and de-maps the electrical signal to provide first and second decoder outputs that reproduce the first and second groups of interleaved outputs, respectively, provided by the interleaver 106 in the transmitter. In the illustrated embodiment, the output of the detector 402 is split onto a first path 418 coupled to the de-mapper second FEC code decoder 401 and a second path 420 coupled to the de-mapper 403. The data on the first path 418 includes the mapped data associated with the first group of interleaved outputs provided at the output of the interleaver in the transmitter. The data on the second path 420 includes the mapped data associated with the second group of interleaved outputs provided at the output of the interleaver in the transmitter.

The de-mapper and second FEC code decoder 401 receives the output of the detector 402 and uses the second FEC code to reverse the mapping of data to the modulation format that occurred at the transmitter to provide associated symbol log likelihood ratios (LLR) to the bit LLR calculator 404. The de-mapper 403 receives the output of the detector 402 and reverses the mapping of data to the modulation format that occurred at the transmitter to provide associated symbol log likelihood ratios (LLR) to the bit LLR calculator 404. As shown, de-mapping in the de-mapper and second FEC code decoder 410 and in the de-mapper 403 is performed iteratively in response to a priori log likelihood ratio (LLR) feedback from the output of the receiver, i.e. the output of the multiplexer 410 in the illustrated embodiment.

The de-mapper and second FEC decoder 401 may be provided in a variety of configurations. In one embodiment, for example, the de-mapper and second FEC code decoder 401 may be configured as a known maximum a posteriori (MAP) detector. The de-mapper 403 may also be provided in a variety of configurations. In one embodiment, for example, the de-mapper 403 may be configured to produce symbol LLRs using the expected Euclidean distance (illustrated in FIG. 3A for example) between the mapped symbols in a known manner.

Each symbol LLR at the output of the de-mapper and second FEC decoder 401 represents the value of a symbol mapped by the mapper 210 in the transmitter in response to the second FEC code encoder outputs. Each symbol LLR at the output of the de-mapper 403 represents the value of a symbol mapped by the mapper 210 in the transmitter in response to the second group of coded and interleaved outputs of the interleaver 206. The symbol LLRs at the output of the de-mapper and second FEC code decoder 401 and at the output of the de-mapper 403 are coupled to the bit LLR calculator 404, which calculates bit LLR values associated with the symbol LLRs in a known manner. If block interleavers 216, 218 were used in the transmitter, the symbol LLRs may be coupled from the de-mapper and second FEC code decoder 401 and the de-mapper 403 to the bit LLR calculator 404 through associated block-deinterleavers 412, 414 that reverse the interleaving imparted by the block interleavers 216, 218 at the transmitter.

The bit LLR values at the output of the bit LLR calculator 404 are provided as the output of the decoder 416 and reproduce the output of the interleaver 206 in the transmitter (either in serial or parallel data streams) and are coupled to the de-interleaver 406. The de-interleaver 406 reverses the bit-interleaving performed by the interleaver 206 in the transmitter and provides k associated outputs to the first FEC code decoders 408-1, 408-2 . . . 408-*k*. The first FEC code decoders 408-1, 408-2 . . . 408-*k* may each be configured to decode the data stream received thereby using the first FEC code and the bit LLR information received from the bit LLR calculator 404. The k decoded outputs of each of the first FEC code decoders 408-1, 408-2 . . . 408-*k* are coupled to a known multiplexer 410. The multiplexer 410 multiplexes the k de-mapped, de-interleaved and decoded bit streams 409-1, 409-2 . . . 409-*k* to produce the serial digital output 118-N of the receiver.

The output 118-N is fed back to the de-mapper and second FEC decoder 401 through the interleaver 411 to provide a priori LLR information used by the de-mapper and second FEC decoder 401 and the de-mapper 403 in decoding the inputs thereto. The interleaver 411 essentially reverses the de-interleaving performed by the de-interleaver 406 and the block de-interleavers 412, 414.

Those of ordinary skill in the art will recognize that a modified BICM-ID scheme consistent with the present disclosure may be provided in a variety of configurations. In one embodiment consistent with the present disclosure, the first FEC code may be a 20% overhead LDPC code, the second FEC code may be an SPC code and data modulation may be performed using a 16-QAM format to produce a modulated signal as illustrated, for example, in FIG. 3A. Such an embodiment may be referred to an HSPC-BICM-ID scheme with a 20% overhead LDPC.

Figure 5:
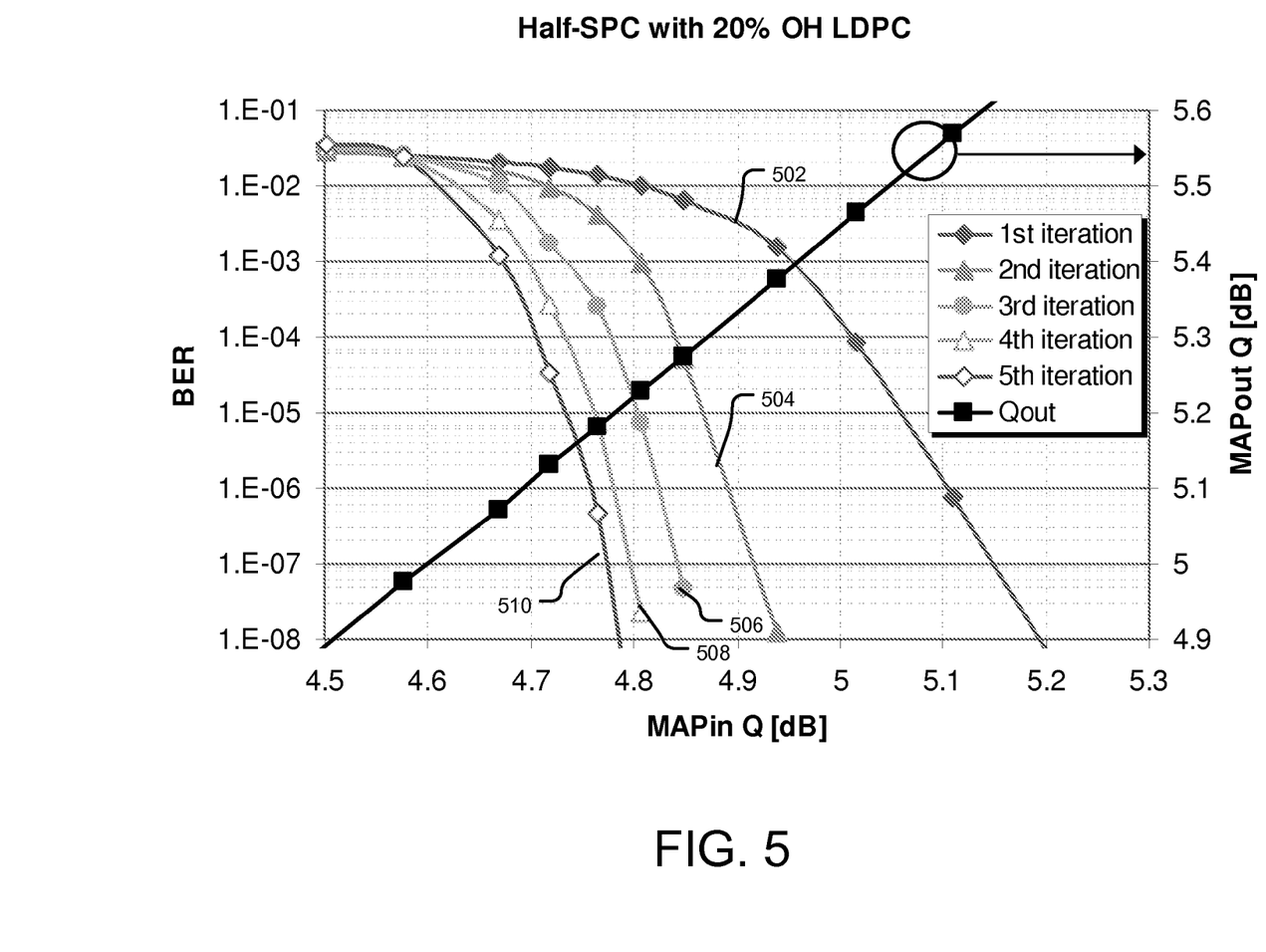
FIG. 5 is a plot of BER vs. input Q, and also showing output Q, illustrating performance of an exemplary HSPC-BICM-ID scheme consistent with the present disclosure.

Performance of such an embodiment is illustrated in FIG. 5. FIG. 5 includes measured plots 502, 504, 506, 508 and 510 of the bit error rate (BER) at the output of the receiver vs. Q (dB) at the input of the de-mapper and second FEC decoder 401 and the de-mapper 403 (MAP in Q[db]) along with the corresponding Q (dB) at the output of the bit LLR calculator 404 (MAP out Q[dB]). For iterative decoding, the iteration starting at the input of the de-mapper and second FEC decoder 401 and the de-mapper 403 and ending at the output of the first FEC code decoders 408-1, 408-2 . . . 408-*k* is one outer iteration. The first FEC code decoders 408-1, 408-2 . . . 408-*k* may perform associated inner iterations. For example, a LDPC decoder may perform two inner iterations for each outer iteration. Each plot 502, 504, 506, 508 and 510 is associated with a different outer iteration of the decoding at the receiver. As shown, an HSPC-BICM-ID system consistent with the present disclosure produces significant FEC threshold improvement with iterative decoding. After five outer iterations (and ten inner iterations) a system consistent with the present disclosure may produce an input Q factor threshold of 4.9 dB at a BER of $10^{-15}$.

Figure 6:
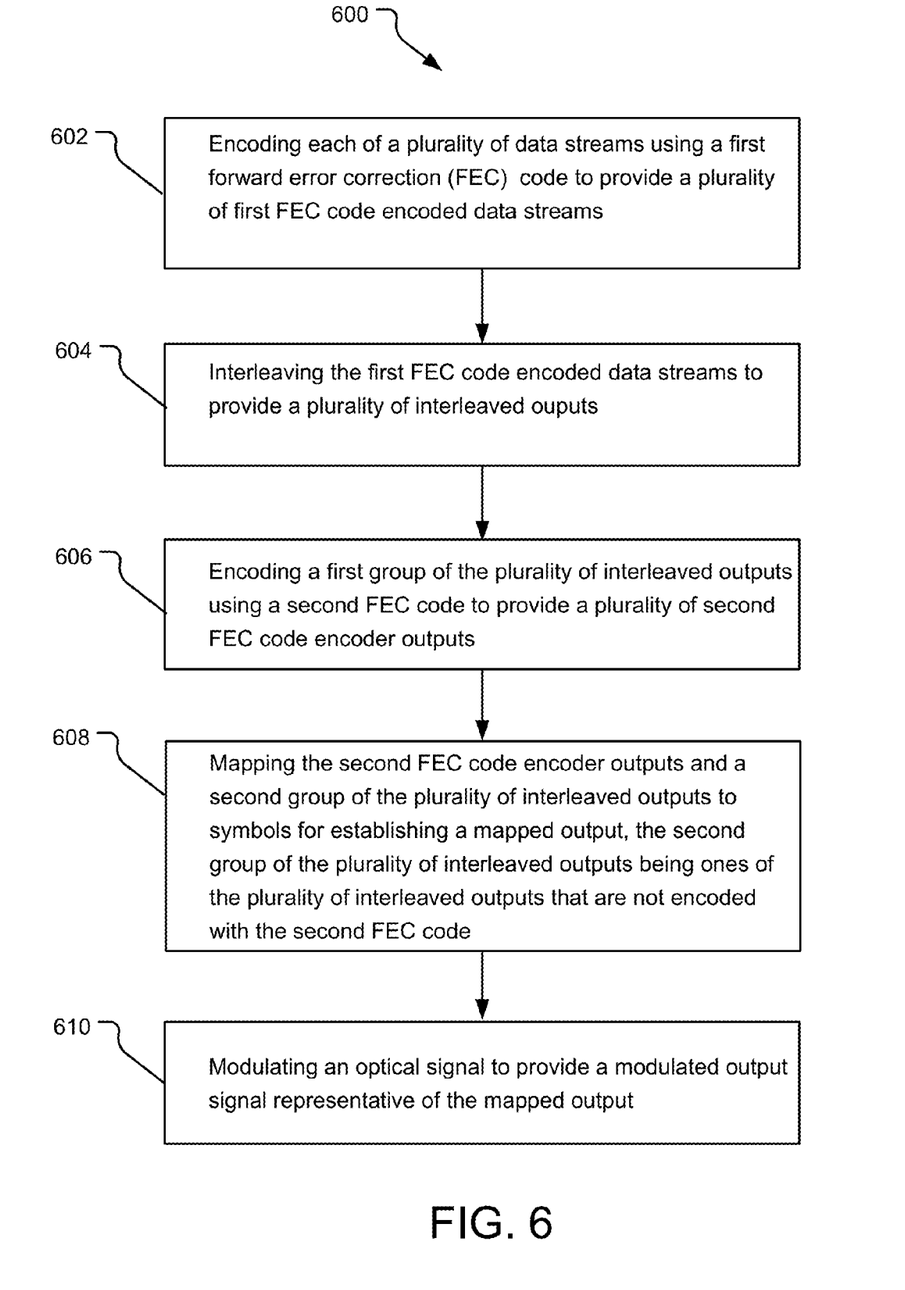
FIG. 6 is flow chart illustrating one example of a method consistent with the present disclosure.

FIG. 6 is a flow chart illustrating a method 600 consistent with the present disclosure. Operation 602 includes encoding each of a plurality of data streams using a first forward error correction (FEC) code to provide a plurality of first FEC code encoded data streams. The first FEC code encoded data streams are interleaved 604 to provide output plurality of interleaved outputs. A first group of the interleaved output is encoded 606 using a second FEC code to provide a plurality of second FEC code encoder outputs. The second FEC code encoder outputs and a second group of the plurality of interleaved outputs are mapped 608 to symbols for establishing a mapped output. The second group of the plurality of interleaved outputs are ones of the plurality of interleaved outputs that are not encoded with the second FEC code. An optical signal is modulated 610 to provide a modulated output signal representative of the mapped output.

While FIG. 6 illustrates various operations according to an embodiment, it is to be understood that not all of the operations depicted in FIG. 6 are necessary for other embodiments. Indeed, it is fully contemplated herein that in other embodiments of the present disclosure, the operations depicted in FIG. 6, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

According to one aspect of the disclosure there is provided a system including: a plurality of first forward error correction (FEC) code encoders, each of the first FEC code encoders being configured to encode an associated input signal using a first FEC code and provide an associated first FEC code encoded output; an interleaver coupled to the plurality of first FEC code encoders and configured to provide a plurality of interleaved outputs, each of the interleaved outputs comprising at least a portion of the associated first FEC code encoded output of the at least one of the plurality of first FEC code encoders; a second FEC code encoder coupled to the interleaver and configured to encode a first group of the interleaved outputs with a second FEC code and provide an associated plurality of second FEC code encoder outputs; a mapper coupled to the second FEC code encoder and configured to map the plurality second FEC code encoder outputs and a second group of the interleaved outputs to symbols for establishing a mapped output, the second group of interleaved outputs being ones of the plurality of interleaved outputs that are not encoded with the second FEC code; and a modulator coupled to the mapper and configured to modulate an optical signal in response to the mapped output to provide a modulated output signal.

According to another aspect of the disclosure, there is provided an optical signal receiver including: a decoder including a second forward error correction (FEC) decoder configured to receive an interleaved signal encoded with first and second FEC codes and decode at least a first portion of the signal using the second FEC code to provide first decoder output signals, the decoder further comprising a de-mapper configured to de-map at least a second portion of the signal to provide second decoder output signals; a de-interleaver coupled to the decoder and configured to provide a plurality of de-interleaved outputs in response to the first and second decoder output signals; and a plurality of first FEC code decoders, each of the first FEC code decoders being configured to receive an associated one of the de-interleaved outputs and provide an associated first FEC code decoded output signal.

According to another aspect of the disclosure there is provided a method including: encoding each of a plurality of data streams using a first forward error correction (FEC) code to provide a plurality of first FEC code encoded data streams; interleaving the first FEC code encoded data streams to provide a plurality of interleaved outputs; encoding a first group of the plurality of interleaved outputs using a second FEC code to provide a plurality of second FEC code encoder outputs; mapping the second FEC code encoder outputs and a second group of the plurality of interleaved outputs to symbols for establishing a mapped output, the second group of the plurality of interleaved outputs being ones of the plurality of interleaved outputs that are not encoded with the second FEC code; and modulating an optical signal to provide a modulated output signal representative of the mapped output.

Embodiments of the methods described herein may be implemented using a processor and/or other programmable device. To that end, the methods described herein may be implemented on a tangible, computer readable storage medium having instructions stored thereon that when executed by one or more processors perform the methods. Thus, for example, the transmitter and/or receiver may include a storage medium (not shown) to store instructions (in, for example, firmware or software) to perform the operations described herein. The storage medium may include any type of tangible medium, for example, any type of disk including floppy disks, optical disks, compact disk read-only memories (CD-ROMs), compact disk re-writables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic instructions.

It will be appreciated by those skilled in the art that any block diagrams herein represent conceptual views of illustrative circuitry embodying the principles of the disclosure. Similarly, it will be appreciated that any flow charts, flow diagrams, state transition diagrams, pseudocode, and the like represent various processes which may be substantially represented in computer readable medium and so executed by a computer or processor, whether or not such computer or processor is explicitly shown. Software modules, or simply modules which are implied to be software, may be represented herein as any combination of flowchart elements or other elements indicating performance of process steps and/or textual description. Such modules may be executed by hardware that is expressly or implicitly shown.

The functions of the various elements shown in the figures, including any functional blocks, may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read-only memory (ROM) for storing software, random access memory (RAM), and non-volatile storage. Other hardware, conventional and/or custom, may also be included.

As used in any embodiment herein, "circuitry" may comprise, for example, singly or in any combination, hardwired circuitry, programmable circuitry, state machine circuitry, and/or firmware that stores instructions executed by programmable circuitry. In at least one embodiment, the transmitter and receiver may comprise one or more integrated circuits. An "integrated circuit" may be a digital, analog or mixed-signal semiconductor device and/or microelectronic device, such as, for example, but not limited to, a semiconductor integrated circuit chip.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A system comprising:
   a plurality of first forward error correction (FEC) code encoders, each of said first FEC code encoders being configured to encode an associated input signal using a first FEC code and provide an associated first FEC code encoded output;
   an interleaver coupled to said plurality of first FEC code encoders and configured to provide a plurality of interleaved outputs, each of said interleaved outputs comprising at least a portion of said associated first FEC code encoded output of said at least one of said plurality of first FEC code encoders;
   a second FEC code encoder coupled to said interleaver and configured to encode a first group of said interleaved outputs with a second FEC code and provide an associated plurality of second FEC code encoder outputs;
   a mapper coupled to said second FEC code encoder and configured to map said plurality second FEC code encoder outputs and a second group of said interleaved outputs to symbols for establishing a mapped output, said second group of interleaved outputs being ones of said plurality of interleaved outputs that are not encoded with said second FEC code; and
   a modulator coupled to said mapper and configured to modulate an optical signal in response to said mapped output to provide a modulated output signal.

2. A system according to claim 1, wherein said second FEC code comprises a single parity check (SPC) code.

3. A system according to claim 1, wherein said first FEC code comprises a low density parity check code (LDPC).

4. A system according to claim 1, wherein said modulated output signal has a quadrature amplitude modulation (QAM) format.

5. A system according to claim 1, wherein said first FEC code comprises a low density parity check (LDPC) code and said second FEC code comprises a single parity check (SPC) code.

6. A system according to claim 1, wherein said mapper is a Gray mapper configured to map said second FEC code encoded output and said second group of said interleaved outputs to symbols using a Gray code.

7. A system according to claim 1, said system further comprising a demultiplexer configured to receive a serial input data stream and demultiplex said serial input data stream into a plurality of demultipexed data streams, each of said demultiplexed data streams being coupled to an associated one of said first FEC code encoders as said associated input signal.

8. A system according to claim 1, said system further comprising:
   a first block interleaver coupled between said second FEC code encoder and said mapper for interleaving said plurality of second FEC code encoder outputs; and
   a second block interleaver coupled between said interleaver and said mapper for interleaving said second group of interleaved outputs.

9. A system according to claim 1, said system further comprising:
   a detector configured to provide an electrical output signal representative of said modulated output signal;
   a decoder comprising a second FEC decoder configured to receive said electrical output signal and decode at least a first portion of said electrical output signal using said second FEC code to provide first decoder output signals representative of said first group of interleaved outputs, said decoder being further configured to de-map at least a second portion of said electrical output signal to provide second decoder output signals representative of said second group of interleaved outputs;

an de-interleaver coupled to said decoder and configured to provide a plurality of de-interleaved outputs in response to said first and second decoder output signals; and a plurality of first FEC code decoders, each of said first FEC code decoders being configured to receive an associated one of said de-interleaved outputs and provide an associated first FEC code decoded output signal.

10. A system according to claim 9, said system further comprising a multiplexer configured to receive each of said first FEC code decoded output signals and multiplex said first FEC code decoded output signals into a serial output data stream.

11. An optical signal receiver comprising:

a decoder comprising a second forward error correction (FEC) decoder configured to receive an interleaved signal encoded with first and second FEC codes and decode at least a first portion of said interleaved signal using said second FEC code to provide first decoder output signals, said decoder further configured to de-map at least a second portion of said interleaved signal to provide second decoder output signals;

a de-interleaver coupled to said decoder and configured to provide a plurality of de-interleaved outputs in response to said first and second decoder output signals; and a plurality of first FEC code decoders, each of said first FEC code decoders being configured to receive an associated one of said de-interleaved outputs and provide an associated first FEC code decoded output signal.

12. A receiver according to claim 11, wherein said second FEC code comprises a single parity check (SPC) code.

13. A receiver according to claim 11, wherein said first FEC code comprises a low density parity check code (LDPC).

14. A receiver according to claim 11, wherein said first FEC code comprises a low density parity check (LDPC) code and said second FEC code comprises a single parity check (SPC) code.

15. A method comprising:

encoding each of a plurality of data streams using a first forward error correction (FEC) code to provide a plurality of first FEC code encoded data streams;

interleaving said first FEC code encoded data streams to provide a plurality of interleaved outputs;

encoding a first group of said plurality of interleaved outputs using a second FEC code to provide a plurality of second FEC code encoder outputs;

mapping said second FEC code encoder outputs and a second group of said plurality of interleaved outputs to symbols for establishing a mapped output, said second group of said plurality of interleaved outputs being ones of said plurality of interleaved outputs that are not encoded with said second FEC code; and modulating an optical signal to provide a modulated output signal representative of said mapped output.

16. A method according to claim 15, said method further comprising:

detecting said modulated output signal to provide an electrical output signal representative of said modulated output signal;

decoding a first portion of said electrical output signal using said second FEC code to provide first decoder output signals representative of said first group of interleaved outputs;

de-mapping a second portion of said electrical output signal to provide second decoder output signals representative of said second group of interleaved outputs;

de-interleaving said first and second decoder output signals to provide a plurality of de-interleaved outputs;

decoding said de-interleaved outputs using said first FEC code to provide a plurality of first FEC code decoded outputs; and multiplexing said first FEC code decoded outputs to provide an output data signal.

17. A method according to claim 15, said method further comprising:

receiving an input signal; and demultiplexing said input signal to provide said plurality of data streams.

18. A method according to claim 15, wherein said mapping comprises mapping said second FEC code encoder outputs and second group of said interleaved outputs to said symbols using a Gray code.

19. A method according to claim 15, wherein said second FEC code comprises a single parity check (SPC) code.

20. A method according to claim 15, wherein said first FEC code comprises a low density parity check code (LDPC).

\* \* \* \* \*